United States Patent [19]
Fiat et al.

[11] Patent Number: 5,675,254
[45] Date of Patent: Oct. 7, 1997

[54] DOUBLE-RESONANCE MRI COIL

[75] Inventors: Daniel Fiat, Oak Park, Ill.; Janez Dolinsek, Ljubljana, Slovenia

[73] Assignee: The Board of Trustees of the University of Illinois, Urbana, Ill.

[21] Appl. No.: 623,667

[22] Filed: Mar. 28, 1996

Related U.S. Application Data

[63] Continuation of Ser. No. 501,888, Jul. 13, 1995, abandoned, which is a continuation of Ser. No. 105,419, Aug. 12, 1993, abandoned, which is a continuation-in-part of Ser. No. 71,582, Jun. 2, 1993, Pat. No. 5,433,196.

[51] Int. Cl.$^6$ ................................................... G01R 33/34
[52] U.S. Cl. ................................................................ 324/318
[58] Field of Search ................................ 324/300, 318, 324/322; 335/279

[56] References Cited

U.S. PATENT DOCUMENTS

| | | | |
|---|---|---|---|
| 4,446,431 | 5/1984 | McKay | 324/318 |
| 4,677,382 | 6/1987 | Vatis | 324/307 |
| 4,689,563 | 8/1987 | Bottomley et al. | 324/309 |
| 4,691,163 | 9/1987 | Blass et al. | 324/318 |
| 4,742,304 | 5/1988 | Schnall et al. | 324/318 |
| 4,792,759 | 12/1988 | Keren et al. | 324/318 |
| 4,801,885 | 1/1989 | Meissner et al. | 324/318 |
| 4,890,063 | 12/1989 | Haragashira | 324/322 |
| 4,916,418 | 4/1990 | Rath | 324/318 |
| 4,928,064 | 5/1990 | Keren | 324/318 |
| 4,952,879 | 8/1990 | Van Vaals et al. | 324/318 |
| 5,038,105 | 8/1991 | Codrington | 324/318 |
| 5,057,778 | 10/1991 | Rath | 324/318 |
| 5,162,739 | 11/1992 | Doty | 324/322 |
| 5,210,494 | 5/1993 | Brunner et al. | 324/318 |
| 5,229,724 | 7/1993 | Zeiger | 324/318 |
| 5,245,285 | 9/1993 | Ishizuka et al. | 324/318 |

FOREIGN PATENT DOCUMENTS

| | | | |
|---|---|---|---|
| 3634030 | 4/1988 | Germany | G01N 24/04 |

OTHER PUBLICATIONS

Cross et al., *Single coil probe with transmission–line tuning for nuclear double resonance*, 47(12) 1486 (Dec., 1976).

Doty et al., *A Multinuclear Double Tuned Probe for Applications with Solids or Liquids Utilizing Lumped Tuning Elements*, 43 Journal of Magnetic Resonance 399 (1988).

Fiat et al., *Determination of the Rate of Cerebral Oxygen Consumption and regional Blood Flow by $^{17}O$ In Vivo NMR Spectroscopy and Magnetic Resonance Imaging*, 14 Neurological Research 303 (Sep., 1992).

Fiat et al., *Determination of the Rate of Cerebral Oxygen Consumption and Regional Cerebral Blood Flow by Non–Invasive $^{17}O$ In Vivo NMR Spectroscopy and Magnetic Resonance Imaging*, 15 Neurological Research 7 (Feb. 1993).

Fiat et al., *Monitoring Cerebral Oxygen Consumption with In Vivo Imaging $^{17}O$ NMR*, Presented at the XVth International Symposium on Cerebral Flow and Metabolism, Jun. 1–6, 1996, Miami, Florida.

(List continued on next page.)

*Primary Examiner*—Sandra L. O'Shea
*Assistant Examiner*—Roger Phillips
*Attorney, Agent, or Firm*—Welsh & Katz, Ltd.

[57] ABSTRACT

A double-resonance coil for use in MRI having a coil element, a first input/output terminal coupled to the coil element, and a second input/output terminal coupled to the coil element. A first resonance means is coupled between the coil element and the first input/output terminal to cause the MRI coil to resonate at a first MRI frequency, and a second resonance means is coupled between the coil element and the second input/output terminal to cause the MRI coil to resonate at a second MRI frequency substantially different than the first MRI frequency. The double resonance coil includes a first frequency-blocking means coupled to the coil element for substantially preventing the second MRI frequency from being detected at the first input/output terminal and a second frequency-blocking means coupled to the coil element for substantially preventing the first MRI frequency from being detected at the second input/output terminal.

20 Claims, 2 Drawing Sheets

OTHER PUBLICATIONS

Fiat et al., *In Vivo $^{17}O$ NMR Study of Rat Brain during $O_2$ Inhalation*, 24 Magnetic Resonance in Medicine 370 (Apr., 1992).

Fiat et al., *$^{17}O$ NMR and MRI Determination of Cerebral Metabolism of Oxygen ($rCMRO_2$) and Cerebral Blood Flow ($rCBF$)[1] in the Man*, (1993).

Kan et al., *A single coil triple resonance probe for NMR experiments*, 51(7) Rev. Sci. Instr. 887 (Jul., 1980).

McFarland et al., *Chemical Exchange Magnetic Resonance Imaging (Chemi)*, 6 Magnetic Resonance Imaging 507 (1988).

Mateescu et al., *Water, Ions and 0–17 Magnetic Resonance Imaging, Water and Ions in Biological Systems* 239 (1988).

Mateescu et al., *Oxygen–17 FIRS: In Vivo Evaluation of Water Uptake and Residence Time in the Mouse Brain after Injection of 0–17 Labelled Water*, p. 1236 (1990).

Mateescu et al., *Oxygen–17 MRI and MRS of the Brain, the Heart and Coronary Arteries*, (1989).

Mateescu et al., *Oxygen–17: A physiological, biochemical, and Anatomical Mri Contrast Agent*, Society of Magnetic Resonance in Medicine 600 (1988).

Mateescu et al., *Oxygen–17 Magnetic Resonance: In Vivo Detection of Nascent Mitochondrial Water in Animals Breathing $^{17}O_2$ Enriched Air*, Society of Magnetic Resonance in Medicine (1991).

Mateescu et al., *Combined $^{17}O/^{1}H$ Magnetic Resonance Microscopy in Plants, Animals and Materials: Present Status and Potential, Synthesis and Applications of Isotopically Labelled Compounds* 499 (1988).

Pekar et al., *In Vivo Measurement of Cerebral Oxygen Consumption and Blood Flow Using $^{17}O$ Magnetic Resonance Imaging*, 21 Magnetic Resonance in Medicine 313 (1991).

Schnall et al., *A New Double–Tuned Probe for Concurrent $^1H$ and $^P$ NMR*, 65 Journal of Magnetic Resonance 122 (1985).

Doty et al, "A Multinuclear Double Tuned Probe for Applications with Solids of Liquids Utilizing Lump Tuning Elements." J. of Mag. Res 43,399–416 (1981).

Kan et al, "A Single Coil Triple Resonance Probe for NMR Experiments" Rev Sci Instrm. 51(7) pp. 887–890 (Jul. 1980).

Cross et al, "Single Coil Probe with Transmission–line Tuning for Nuclear Double Resonance." vol. 47 No. 12 pp. 1486–1488 (Dec. 1976).

Fiat, et al., "Determination of the Rate of Cerebral Oxygen Consumption and Regional Cerebral Blood Flow by Non–Invasive $^{17}O$ In Vivo NMR Spectroscopy and Magnetic Resonance Imaging," Neurological Research, vol. 14, pp 303–311 (Sep. 1992).

Fiat, et al., "Determination of the Rate of Cerebral Oxygen Consumption and Regional Cerebral Blood Flow by Non–Invasive $^{17}O$ In Vivo NMR Spectroscopy and Magnetic Resonance Imaging," Neurological Research, vol. 15, pp. 7–22 (Feb. 1993).

Fiat, et al., "Monitoring Cerebral Oxygen Consumption with In Vivo Imaging $^{17}O$ NMR," Presented at the XVth International Symposium on Cerebral Flow and Metabolism, Jun. 1–6, 1991, Miami, Florida.

Fiat, et al. "In Vivo $^{17}O$ NMR Study of Rat Brain during $^{17}O_2$ Inhalation," *Magnetic Resonance in Medicine* 24, pp 370–374, (Apr. 1992).

Fiat, et al., "$^{17}O$ NMR and MRI Determination of Cerebral Metabolism of Oxygen ($rCMRO_2$) and Cerebral Blood Flow ($rCBF$)[1] in the Man" (1993).

McFarland, et al., "Chemical Exchange Magnetic Resonance Imaging (Chemi)," *Magnetic Resonance Imaging*, vol. 6, pp 507–515 (1988).

Mateescu, et al., "Water, Ions and O–17 Magnetic Resonance Imaging," *Water and Ions in Biological Systems*, pp 239–250 (1988).

Mateescu, et al., "Oxygen–17 MRS: In Vivo Evaluation of Water Uptake and Residence Time in the Mouse Brain after Injection of O–17 Labelled Water," p. 1236 (1990).

Mateescu, et al., "Oxygen–17 MRI and MRS of the Brain, the Heart and Coronary Arteries," (1989).

Mateescu, et al., "Oxygen–17: A Physiological, Biochemical and Anatomical MRI Contrast Agent," *Society of Magnetic Resonance in Medicine*, p. 600 (1988).

Mateescu, et al., "Oxygen–17 Magnetic Resonance: In Vivo Detection of Nascent Mitochondrial Water in Animals Breathing $^{17}O_2$ Enriched Air," Society of Magnetic Resonance in Medicine (1991).

Mateescu, et al., "Combined $^{17}O/^{1}H$ Magnetic Resonance Microscopy in Plants, Animals and Materials: Present Status and Potential," *Synthesis and Applications of Isotopically Labelled Compounds*, pp 499–508 (1988).

Pekar, et al., "In Vivo Measurement of Cerebral Oxygen Consumption and Blood Flow Using $^{17}O$ Magnetic Resonance Imaging," *Magnetic Resonance in Medicine* 21, pp. 313–319 (1991).

Schnall, et al., "A New Double–Tuned Probe for Concurrent $^1H$ and $^{31}P$ NMR," *Journal of Magnetic Resonance* 65, pp 122–129 (1985).

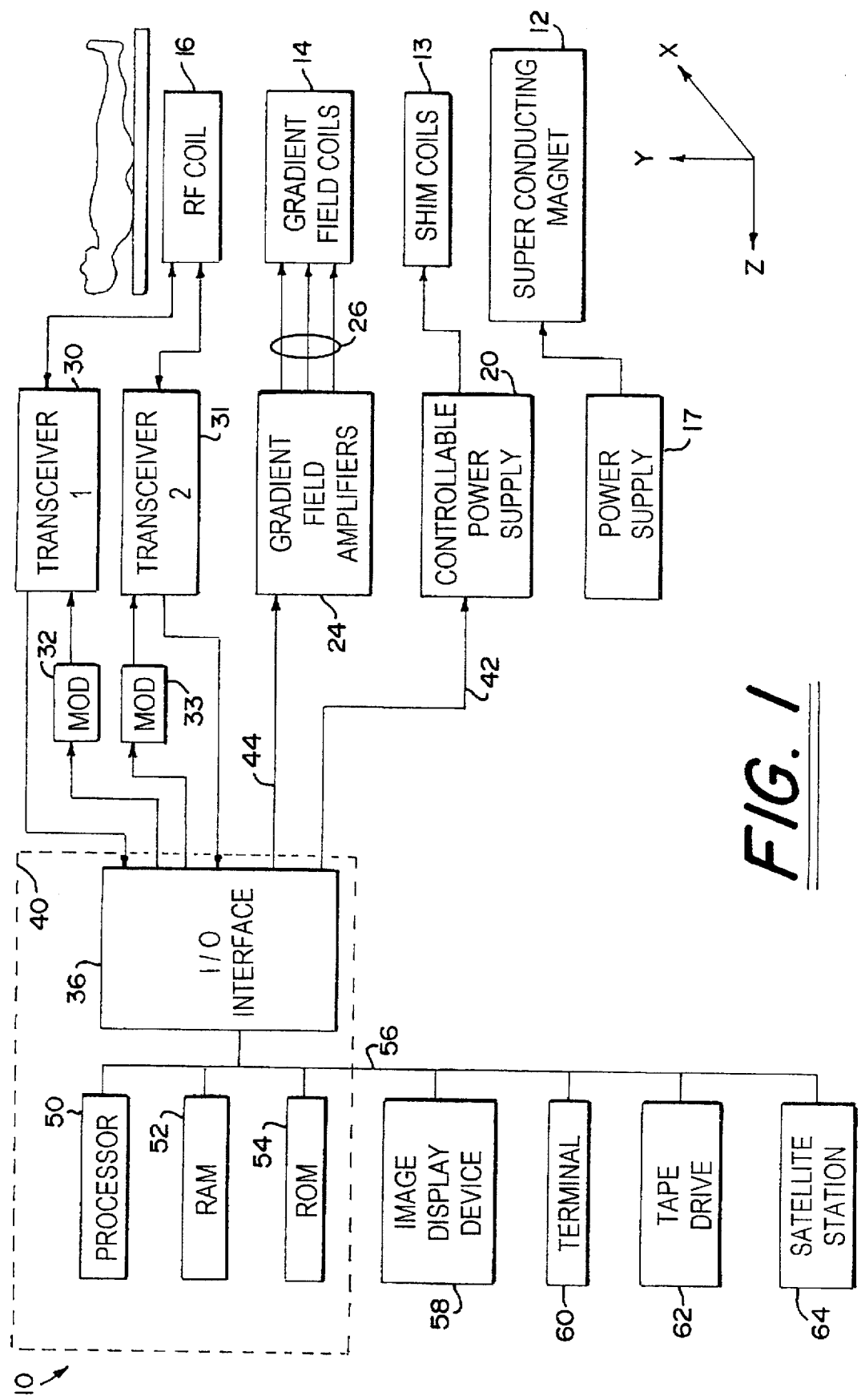

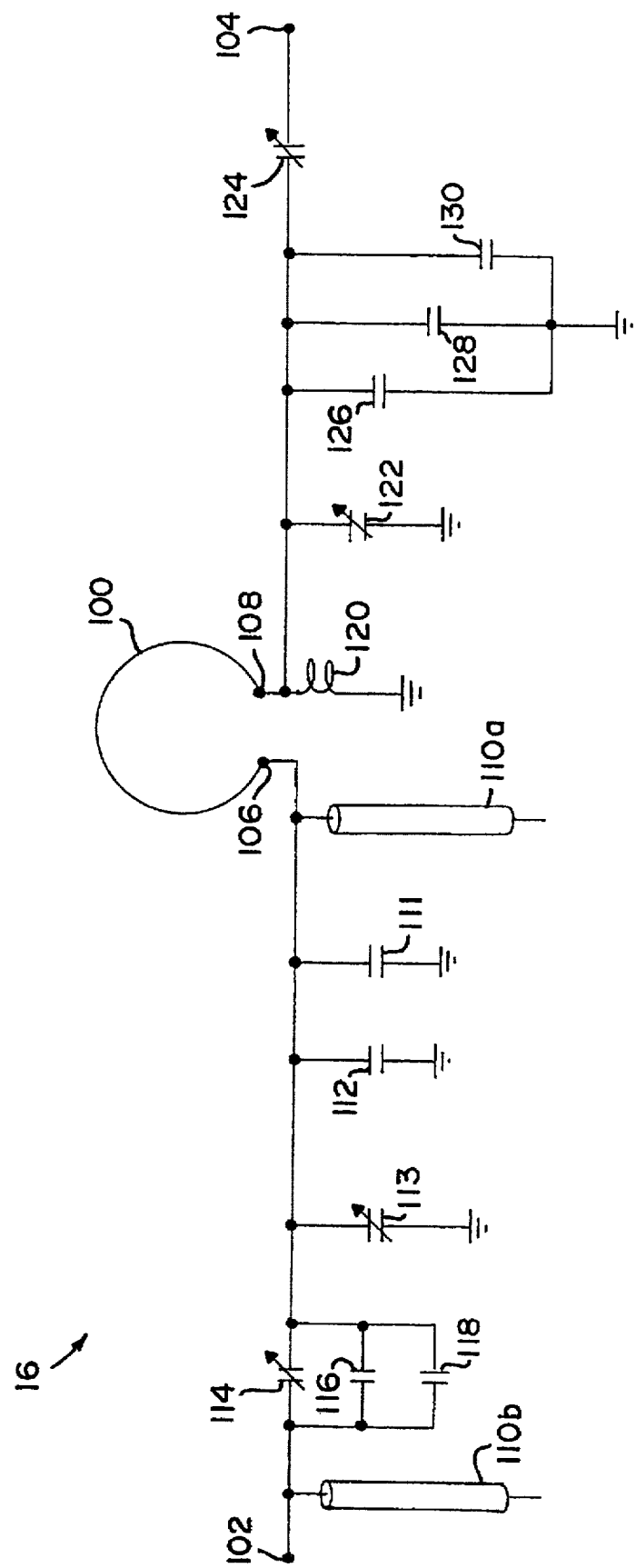

DOUBLE-RESONANCE MRI COIL

This is a Continuation of U.S. application Ser. No. 08/501,888, filed Jul. 13, 1995, now abandoned which is a Continuation of U.S. application Ser. No. 08/105,419, filed Aug. 12, 1993, now abandoned and which is a continuation-in-part of U.S. Ser. No. 08/071,582, entitled "Oxygen-17 NMR Spectroscopy and Imaging in the Human," filed Jun. 2, 1993, now U.S. Pat. No. 5,433,196.

BACKGROUND OF THE INVENTION

The present invention relates to a double-resonance coil for use in NMR spectroscopy and imaging which allows simultaneous radiation and detection at two different radio frequencies.

Nuclear magnetic resonance (MRI) spectroscopy and magnetic resonance imaging (MRI) are used in various medical applications. For example, conventional MRI systems in widespread use generate an anatomical image of a selected portion of the human body by utilizing a radio-frequency (RF) coil to irradiate the selected body portion with radiation at a frequency of 63.9 MHz, which causes nuclear magnetic resonance of hydrogen-1 constituents (protons) in the selected body portion at 1.5 Tesla. The image is then generated based on changes in the nuclear signal sensed via the RF coil.

It has been suggested that dual-frequency MRI, which would generate and detect RF energy at two frequencies, could be utilized via a double-resonance MRI coil. For example, in an abstract entitled Oxygen-17: A Physiological, Biochemical and Anatomical MRI Contrast Agent from the Seventh Annual Meeting of the Society of Magnetic Resonance in Medicine, Mateescu, et al. state: "$A^{17}O/^1H$ double resonance probe was used in experiments in which reliable superposition of oxygen and proton images was sought."

In U.S. Pat. No. 4,742,304, Schnall, et al. disclose a multiple-tuned NMR probe which can radiate RF energy and detect changes in the RF energy at a number of different frequencies. While the patent states that the NMR probe allows "simultaneous study of different nuclei" (col. 1, lines 7–8), it is apparent that the NMR probe is excited with the different NMR frequencies consecutively, not simultaneously. The Schnall, et al. probes's inability to be used in simultaneous NMR spectroscopy and/or imaging is apparent from the fact it only has one input/output terminal: "It is another object of the present invention to provide such a multiple-tuning NMR probe in which all frequencies are generated and detected using a single input/output terminal." Column 2, lines 26–29.

SUMMARY OF THE INVENTION

The present invention is directed to a double-resonance coil for use in MRI. The double-resonance coil includes a coil element, a first input/output terminal coupled to the coil element, and a second input/output terminal coupled to the coil element. A first resonance means is coupled between the coil element and the first input/output terminal to cause the double-resonance coil to resonate at a first MRI frequency, and a second resonance means is coupled between the coil element and the second input/output terminal to cause the double-resonance coil to resonate at a second MRI frequency different than the first MRI frequency. The double-resonance coil includes a first frequency-blocking means coupled to the coil element for substantially preventing the second MRI frequency from being detected at the first input/output terminal and a second frequency-blocking means coupled to the coil element for substantially preventing the first MRI frequency from being detected at the second input/output terminal.

The double-resonance coil in accordance with the present invention would allow, for example, simultaneous excitation of oxygen-17 and hydrogen-1 isotopes present in a portion of a human patient in order to provide accurate superposition of anatomical images produced by hydrogen-1 resonance with images relating to blood flow or oxygen consumption produced by oxygen-17 resonance.

Alternatively, the double-resonance coil could be used to provide simultaneous excitation of xenon-129 and hydrogen-1 constituents in order to, for example, provide accurate superposition of anatomical images produced by hydrogen-1 resonance with images relating to blood flow produced by xenon-129 resonance. The double-resonance coil could also be used to provide simultaneous excitation of xenon-129 and oxygen-17 constituents in order to, for example, provide accurate superposition of images produced by xenon-129 resonance with images produced by oxygen-17 resonance.

The features and advantages of the present invention will be apparent to those of ordinary skill in the art in view of the detailed description of the preferred embodiment, which is made with reference to the drawings, a brief description of which is provided below.

BRIEF DESCRIPTION OF THE DRAWINGS

FIG. 1 illustrates an MRI system for use in connection with humans; and

FIG. 2 is a diagram of an embodiment of the RF coil of FIG. 1.

DETAILED DESCRIPTION OF THE PREFERRED EMBODIMENT

FIG. 1 illustrates a magnetic resonance imaging (MRI) system 10 which operates by magnetically resonating NMR constituents or isotopes such as hydrogen-1 or oxygen-17 in a portion of a human patient. The MRI system 10 includes a plurality of elements for generating various magnetic fields to produce magnetic resonance of the NMR constituents. These elements include a whole body, superconducting magnet 12 for generating a uniform, static magnetic field. The magnet 12 is referred to as a "whole body" magnet since its circumference is large enough to accommodate the entire body of a person. The uniform static magnetic field is generated in the z-direction as shown in FIG. 1. Like most standard MRI systems currently in operation in the United States, the superconducting magnet 12 generates a static magnetic field having a magnitude of 1.5 Tesla. While the magnet 12 is illustrated as a box 12 below the patient, it should be understood that the magnet 12 is generally cylindrical in shape and surrounds the patient. As is conventional, a number of shim coils 13 provide additional static fields to supplement the main static field generated by the magnet 12.

The MRI system 10 includes a number of whole body, gradient field coils 14 which generate magnetic field gradients in the x, y, z directions in a conventional manner to facilitate MRI. In conventional 1.5 Tesla NMR systems, the magnetic field gradients are typically between about 0.5–1.0 gauss/centimeter. The gradient field coils 14 surround the patient. The MRI system 10 also includes an RF coil 16 for generating a resonant electromagnetic field at two radio frequencies for causing magnetic resonance of two different MRI constituents in the patient. The resonant electromagnetic field may be generated in any direction perpendicular to the static field. For example, if the static magnetic field is generated in the z-direction, the resonant field may be generated in any direction in the x-y plane. The RF coil 16 also receives electrical MRI signals caused by the magnetic resonance of the MRI constituents. While the RF coil 16 is shown schematically as a box 16 below the patient, it should be understood that the RF coil may surround the patient, or alternatively, local RF coils for generating localized magnetic fields could be utilized, such as an RF coil for the head of the patient.

A power supply 17 supplies power to the magnet 12; the static fields generated by the shim coils 13, to improve the static field homogeneity, are controlled via a controllable power supply 20; a number of gradient field amplifiers 24 controls the fields generated by the gradient field coils 14 via three lines 26, one line for each of the x, y, z directions. A pair of transceivers 30, 31 and a pair of associated modulators 32, 33 control the field generated by the RF coil 16. The transceivers 30, 31 also detect and receive electrical MRI signals generated from the magnetic resonance of the MRI constituents and supply those signals to a conventional I/O interface 36 of a controller 40. The controllable power supply 20 and the gradient field amplifiers 24 are also connected to the I/O interface 36 via lines 42, 44, respectively.

The I/O interface 36 includes two pairs of analog-to-digital (A/D) converters (not shown), each of which is connected to receive an input after quadrature detection from a respective one of the transceivers 30, 31.

The controller 40 also includes a processor 50, a random-access memory (RAM) 52, and a read-only memory (ROM) 54, all of which are interconnected via a data bus 56. The processor 50 may process the data (MRI signals) received from the two transceivers 30, 31 on a time-shared basis. Alternatively, separate processors 50 could be provided to process the data from the two transceivers 30, 31 simultaneously. An image display device 58, such as a cathode ray tube (CRT), is also connected to the controller 40. Additional components, such as a boot and editing terminal 60, a tape drive 62 for storing data relating to images, and a satellite station 64 for performing spectroscopy may also be connected to the controller 40.

During operation, the MRI system 10 generates a uniform static magnetic field via the superconducting magnet 12 and shim coils 13 and selectively generates the gradient and resonating magnetic fields via the coils 14, 16 so as to generate MRI signals corresponding to a selected volume element of the human subject. As described in U.S. Ser. No. 08/071,582, entitled "Oxygen-17 NMR Spectroscopy and Imaging in the Human," filed Jun. 2, 1993 and assigned to the same assignee, the MRI system 10 could be used to generate oxygen-17 images representing the magnitude of blood flow and/or the rate of oxygen consumption in a human.

An RF coil 16 for allowing either simultaneous or consecutive magnetic resonance of MRI constituents in a human body portion via RF excitation at two different frequencies is shown in FIG. 2. The RF coil 16 could be used to provide simultaneous excitation of oxygen-17 and hydrogen-1 constituents in the human body portion in order to, for example, provide accurate superposition of anatomical images produced by hydrogen-1 resonance with images relating to blood flow or oxygen consumption produced by oxygen-17 resonance. Alternatively, the RF coil 16 could be used to provide simultaneous (or consecutive) excitation of xenon-129 and hydrogen-1 constituents in order to, for example, provide accurate superposition of anatomical images produced by hydrogen-1 resonance with images relating to blood flow produced by xenon-129 resonance. The double-resonance coil could also be used to provide simultaneous excitation of xenon-129 and oxygen-17 constituents in order to, for example, provide accurate superposition of images produced by xenon-129 resonance with images produced by oxygen-17 resonance.

As used herein, "simultaneous excitation" means that the RF coil 16 is provided with two different RF frequencies, one RF frequency at each of its two input/output terminals, at the same instant in time. The term "consecutive excitation" means that two RF frequencies provided to the two input/output terminals are alternated in time so that neither RF frequency is provided at the same instant in time as the other RF frequency.

Referring to FIG. 2, the RF coil 16 includes a circular coil element 100 formed of a single loop of copper tubing and is used about the head of the patient. The diameter of the coil element 100 is 11 centimeters and the diameter of the copper tubing is 0.5 cm. The RF coil 16 has a first input/output terminal 102 connected to the left side of the coil element 100 as shown in FIG. 2 and a second input/output terminal 104 connected to the right side of the coil element 100. The coil element 100 has a first end point 106 on its left side at which point the curved portion of the coil element 100 ends and a second end point 108 on its right side at which the curved portion of the coil element 100 ends.

A number of circuit components are connected between the end point 106 of the coil element 100 and the input/output terminal 102 of the coil element 100. Those circuit elements include two coaxial cables 110a, 110b, a pair of capacitors 111, 112, a variable tuning capacitor 113, a variable impedance-matching capacitor 114, and a pair of capacitors 116, 118 connected in parallel with the impedance-matching capacitor 114. The tuning capacitor 113 is used to tune the circuit to resonate at the RF frequency associated with the input/output 102 terminal. The impedance-matching capacitor 114 is used for conventional impedance-matching purposes. The length of each of the coaxial cables 110a, 110b (which are open at their lower ends) is substantially one-fourth of the wavelength of the RF signal associated with the input/output terminal 104 so that the cables 110 act as a very low impedance (theoretically zero impedance) to prevent the RF signal provided at the terminal 104 from being detected at the terminal 102. One cable 110 may be used, although two λ/4 coaxial cables 110 are preferred to obtain better isolation.

A number of circuit components are connected between the end point 108 of the coil element 100 and the input/output terminal 104 of the coil element 100. Those circuit elements include a smaller coil element 120, a variable tuning capacitor 122, a variable impedance-matching capacitor 124, and three capacitors 126, 128 and 130 connected to ground. The tuning capacitor 122 is used to fine tune the circuit to resonate at the RF frequency associated with the input/output terminal 104. The impedance-matching capacitor 124 is used for conventional impedance-matching purposes.

The smaller coil element 120 is formed of two circular loops, each of which is three centimeters in diameter, of the same copper tubing of the coil element 100, so that the coil element 120 generates a magnetic field in the same direction as the static field generated by the superconducting magnet 12. The smaller coil element 120 and the main coil element 100 are made as one rigid piece. The inductance of the smaller coil element 120 is 50 ohms, which matches the impedance of a coaxial cable.

The purpose of the smaller coil element 120 is to prevent the RF signal provided at the input/output terminal 102 from being detected at the input/output terminal 104 by acting as a low impedance to the RF signal provided at the input/output terminal 102. The impedance of the smaller coil element 120 (which is primarily inductance) is equal to $2\pi fL$, where f is the frequency of the signal provided to the coil element 120 and L is the inductance of the coil element 120. It can be seen that for lower frequencies, the impedance of the coil element 120 is smaller. Thus, when a relatively low frequency signal is provided to the input/output terminal 102 and a relatively high frequency signal is provided to the terminal 104, the low impedance of the smaller coil element 120 substantially prevents the relatively low frequency signal from being detected at the terminal 104.

A first resonant frequency $f_1$ of the MRI coil 10, as seen at the left input/output terminal 102, is determined by the total capacitance $C_1$ of the components in the left branch of the MRI coil between the point 108 and the terminal 102 and the inductance L of the coil element 100 in accordance with the equation $f_1 = 1/(2\pi\sqrt{LC_1})$. Similarly, a second resonant frequency $f_2$ of the MRI coil 10, as seen at the right input/output terminal 104, is determined by the total capacitance $C_2$ of the components in the right branch of the NMR coil total capacitance $C_2$ of the components in the right branch of the NMR coil between the point 106 and the terminal 104 and the inductance L of the coil element 100 in accordance with the equation $f_2 = 1/(2\pi\sqrt{LC_2})$.

In operation, the left input/output terminal 102 of the RF coil 16 is connected to receive and transmit RF signals at a MRI frequency, and the right input/output terminal 104 is connected to receive and transmit RF signals at a second MRI frequency. The first MRI frequency should be lower than the second MRI frequency.

The MRI frequency necessary to cause magnetic resonance of an NMR constituent or isotope present in a human body portion is defined in accordance with the well-known Larmor equation set forth below:

$f = H\lambda/2\pi$ where H is the magnitude of the static magnetic field, where $\lambda$ is the gyromagnetic ratio of the isotope to be magnetically resonated, and where f is the MRI frequency necessary to cause nuclear magnetic resonance. The NMR frequency necessary to magnetically resonate oxygen-17 in a static magnetic field of 1.5 Tesla is 8.66 MHz; the MRI frequency necessary to magnetically resonate hydrogen-1 in a static magnetic field of 1.5 Tesla is 63.9 MHz; and the MRI frequency necessary to magnetically resonate xenon-129 in a static magnetic field of 1.5 Tesla is 17.6 MHz.

If the RF coil 16 were used to simultaneously generate images based on dual oxygen-17/hydrogen-1 resonance, the input/output terminal 102 would be connected to a transceiver operable at 8.66 MHz (the Larmor frequency for oxygen-17 at 1.5 Tesla), and the input/output terminal 104 would be connected to a transceiver operable at 63.9 MHz (the Larmor frequency for hydrogen-1 at 1.5 Tesla). The tuning capacitor 113 would be adjusted so that the coil element 100 resonates at 8.66 MHz when an RF signal of that frequency is provided to the input/output terminal 102, and the tuning capacitor 122 would be adjusted so that the coil element 100 resonates at 63.9 MHz when an RF signal of that frequency is provided to the input/output terminal 104. The length of the coaxial cables 110 would be selected to be about one-fourth of the hydrogen-1 wavelength (63.9 MHz)(79 cm for RG/U400 coaxial cable), and the capacitors in the circuit would have the values indicated in the table set forth below.

| MRI COIL FOR SIMULTANEOUS $^{17}$O/$^1$H RADIATION | |
|---|---|
| Capacitor | Value |
| 111 | 330 pF |
| 112 | 330 pF |
| 113 | 2–120 pF |
| 114 | 1–18 pF |
| 116 | 10 pF |
| 118 | 10 pF |
| 122 | 1–10 pF |
| 124 | 1–10 pF |
| 126 | 10 pF |
| 128 | 10 pF |
| 130 | 10 pF |

If the RF coil 16 were used to simultaneously generate images based on dual xenon-129/hydrogen-1 resonance, the input/output terminal 102 would be connected to a transceiver operable at 17.6 MHz (the Larmor frequency for xenon-129 at 1.5 Tesla), and the input/output terminal 104 would be connected to a transceiver operable at 63.9 MHz (the Larmor frequency for hydrogen-1 at 1.5 Tesla). The tuning capacitor 113 would be adjusted so that the coil element resonates at 17.6 MHz when an RF signal of that frequency is provided to the input/output terminal 102, and the tuning capacitor 122 would be adjusted so that the coil element 100 resonates at 63.9 MHz when an RF signal of that frequency is provided to the input/output terminal 104. The length of the coaxial cables 110 would be selected to be about one-fourth of the hydrogen-1 wavelength (63.9 MHz), and the capacitors in the circuit would have the values indicated in the table set forth below.

| MRI COIL FOR SIMULTANEOUS $^{129}$Xe/$^1$H RADIATION | |
|---|---|
| Capacitor | Value |
| 111 | 80 pF |
| 112 | 80 pF |
| 113 | 2–120 pF |
| 114 | 1–18 pF |
| 116 | 2.4 pF |
| 118 | 2.4 pF |
| 122 | 1–10 pF |
| 124 | 1–10 pF |
| 126 | 10 pF |
| 128 | 10 pF |
| 130 | 10 pF |

If the RF coil 16 were used to simultaneously generate images based on dual oxygen-17/xenon-129 resonance, the input/output terminal 102 would be connected to a transceiver operable at 8.66 MHz (the Larmor frequency for oxygen-17 at 1.5 Tesla), and the input/output terminal 104 would be connected to a transceiver operable at 17.6 MHz (the Larmor frequency for xenon-129 at 1.5 Tesla). The tuning capacitor 113 would be adjusted so that the coil element 100 resonates at 8.66 MHz when an RF signal of that frequency is provided to the input/output terminal 102, and the tuning capacitor 122 would be adjusted so that the coil element 100 resonates at 17.6 MHz when an RF signal of that frequency is provided to the input/output terminal 104. The length of the coaxial cables 110 would be selected to be about one-fourth of the xenon-129 wavelength (17.6

MHz), and the capacitors in the circuit would have the values indicated in the table set forth below.

| MRI COIL FOR SIMULTANEOUS $^{17}O/^{129}Xe$ RADIATION | |
|---|---|
| Capacitor | Value |
| 111 | 330 pF |
| 112 | 330 pF |
| 113 | 2–120 pF |
| 114 | 1–18 pF |
| 116 | 10 pF |
| 118 | 10 pF |
| 122 | 1–10 pF |
| 124 | 1–10 pF |
| 126 | 131 pF |
| 128 | 131 pF |
| 130 | 131 pF |

Although the hydrogen-1, oxygen-17, and xenon-129 MRI frequencies have been specifically discussed, other MRI frequencies could be utilized in connection with the double-resonant coil of the present invention.

Numerous modifications and alternative embodiments of the invention will be apparent to those skilled in the art in view of the foregoing description. This description is to be construed as illustrative only, and is for the purpose of teaching those skilled in the art the best mode of carrying out the invention. The details of the structure and method may be varied substantially without departing from the spirit of the invention, and the exclusive use of all modifications which come within the scope of the appended claims is reserved.

What is claimed is:

1. A double-resonance MRI coil for use in magnetic resonance imaging, said double-resonance MRI coil comprising:

a coil element for transceiving an MRI imaging signal;

a first input/output terminal coupled to said coil element;

a second input/output terminal coupled to said coil element;

first resonance means coupled between said coil element and said first input/output terminal for causing said MRI coil to resonate at a first MRI frequency of the MRI imaging signal;

second resonance means coupled between said coil element and said second input/output terminal for causing said MRI coil to resonate at a second MRI frequency of the MRI imaging signal, said second MRI frequency being different than said first MRI frequency, and at least one of said first and second MRI frequencies being less than 20 Mhz.;

first frequency-blocking means coupled to said coil element for substantially preventing said second frequency from being detected at said first input/output terminal, said first frequency-blocking means comprising a coaxial cable having a length; and second frequency-blocking means coupled to said coil element for substantially preventing said first frequency from being detected at said second input/output terminal, said second frequency-blocking means comprising a second coil element.

2. An MRI coil as defined in claim 1 wherein said coil element comprises a coil with a single substantially circular loop.

3. An MRI coil as defined in claim 1 wherein said first resonance means comprises a plurality of capacitors, one of said capacitors being a tuning capacitor.

4. An MRI coil as defined in claim 3 wherein said second resonance means comprises a plurality of capacitors, one of said capacitors being a tuning capacitor.

5. An MRI coil as defined in claim 1 wherein said length of said coaxial cable is substantially equal to one-fourth of the wavelength associated with said second NMR frequency.

6. An MRI coil as defined in claim 5 wherein said first frequency blocking means additionally comprises a second coaxial cable having a length substantially equal to one-fourth of the wavelength associated with said second NMR frequency.

7. An MRI coil as defined in claim 1 wherein said second coil element comprises a coil having two substantially circular loops.

8. The double resonance MRI coil as in claim 1 wherein the first resonance means further comprises a resonator at a magnetically resonate frequency of oxygen-17 and the second resonance means further comprises a resonator at a magnetically resonate frequency of hydrogen-1.

9. The double resonance MRI coil as in claim 1 wherein the first resonance means further comprises a resonator at a magnetically resonate frequency of xenon-129 and the second resonance means further comprises a resonator at a magnetically resonate frequency of hydrogen-1.

10. The double resonance MRI coil as in claim 1 wherein the first resonance means further comprises a resonator at a magnetically resonate frequency of oxygen-17 and the second resonance means further comprises a resonator at a magnetically resonate frequency of xenon-129.

11. A double-resonance NMR imaging coil for use in a magnetic resonance imaging system, said double-resonance NMR coil comprising:

a coil element for transceiving an NMR imaging signal;

a first input/output terminal coupled to said coil element;

a second input/output terminal coupled to said coil element;

first resonance means coupled between said coil element and said first input/output terminal for causing said NMR coil to resonate at a first NMRI frequency of the NMR imaging signal;

second resonance means coupled between said coil element and said second input/output terminal for causing said NMR coil to resonate at a second NMRI frequency of the MRI imaging Signal, said second NMRI frequency being different than said first NMRI frequency;

first frequency-blocking means coupled to said coil element for substantially preventing said second frequency from being detected at said first input/output terminal, said first frequency-blocking means comprising a coaxial-cable having a length; and second frequency-blocking means coupled to said coil element for substantially preventing said first frequency from being detected at said second input/output terminal, said second frequency-blocking means comprising a second coil element disposed to generate a magnetic field in a same direction as a static field generated by a superconducting magnet of the nuclear magnetic resonant imaging system.

12. An NMR coil as defined in claim 11 wherein said coil element comprises a coil with a single substantially circular loop.

13. An NMR coil as define in claim 11 where said first resonance means comprises a plurality of capacitors, one of said capacitors being a tuning capacitor.

14. An NMR coil as defined in claim 13 wherein a said second resonance means comprises a plurality of capacitors, one of said capacitors being a tuning capacitor.

15. An NMR coil as defined in claim 11 wherein said length of aid coaxial cable is substantially equal to one-fourth of the Wavelength associated with said second NMRI frequency.

16. An NMR coil as defined in claim 15 wherein said first frequency blocking means additionally comprises a second coaxial cable having a length substantially equal to one-fourth of the wavelength associated with said second NMRI frequency.

17. An NMR coil as defined in claim 11 wherein said second coil element comprises a coil having two substantially circular loops.

18. An NMR coil as defined in claim 11 wherein the first resonance means further comprises a resonator at a magnetically resonate frequency of oxygen-17 and the second resonance man further comprises a resonator at a magnetically resonate frequency of hydrogen-1.

19. An NMR coil as defined in claim 11 wherein the first resonance means further comprises a resonator at a magnetically resonate frequency of xenon-129 and the second resonance means further comprises a resonator at a magnetically resonate frequency of hydrogen-1.

20. An NMR coil as defined in claim 11 wherein the first resonance means further comprises a resonator at a magnetically resonate frequency of oxygen-17 and the second resonance means further comprises a resonator at a magnetically resonate frequency of xenon-129.

* * * * *